United States Patent
Hong

(10) Patent No.: US 12,089,400 B2
(45) Date of Patent: Sep. 10, 2024

(54) METHOD FOR FORMING SEMICONDUCTOR STRUCTURES AND SEMICONDUCTOR STRUCTURE

(71) Applicant: CHANGXIN MEMORY TECHNOLOGIES, INC., Hefei (CN)

(72) Inventor: Minki Hong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 361 days.

(21) Appl. No.: 17/452,272

(22) Filed: Oct. 26, 2021

(65) Prior Publication Data
US 2022/0293609 A1 Sep. 15, 2022

Related U.S. Application Data

(63) Continuation of application No. PCT/CN2021/107423, filed on Jul. 20, 2021.

(30) Foreign Application Priority Data

Mar. 9, 2021 (CN) .......................... 202110258133.9

(51) Int. Cl.
*H01L 21/00* (2006.01)
*H01L 29/66* (2006.01)
(Continued)

(52) U.S. Cl.
CPC ........... *H10B 12/482* (2023.02); *H01L 28/60* (2013.01); *H01L 29/66666* (2013.01); *H01L 29/7827* (2013.01); *H10B 12/038* (2023.02)

(58) Field of Classification Search
CPC ..... H10B 12/482; H10B 12/038; H01L 28/60; H01L 29/66666; H01L 29/7827
See application file for complete search history.

(56) References Cited

U.S. PATENT DOCUMENTS 8,258,054 B2 9/2012 Ko
10,756,093 B1 8/2020 Pandey et al.
(Continued)

FOREIGN PATENT DOCUMENTS

CN 102104020 A 6/2011
CN 105097536 A 11/2015
(Continued)

OTHER PUBLICATIONS

First Chinese Office Action and English Translation cited in CN 202110258133.9, mailed Nov. 2, 2021, 11 pages.
(Continued)

*Primary Examiner* — Richard A Booth
(74) *Attorney, Agent, or Firm* — Kilpatrick Townsend & Stockton LLP

(57) ABSTRACT

The present disclosure provides a method for forming a semiconductor structure and a semiconductor structure. The method for forming a semiconductor structure includes: providing a substrate, and forming discrete bit line structures on the substrate; forming a first sacrificial layer on the surface of the substrate on the bottoms of gaps of the bit line structures; forming a second sacrificial layer filling the gaps of the discrete bit line structures; patterning the second sacrificial layer and the first sacrificial layer to form openings, the formed openings and the remaining of the second sacrificial layer being arranged alternately in an extension direction of the bit line structures; forming a dielectric layer filling the openings; and, removing the remaining of the first sacrificial layer and the remaining of the second sacrificial layer to form capacitor contact holes, the formed capacitor contact holes and the dielectric layer being arranged alternately.

15 Claims, 6 Drawing Sheets

(51) Int. Cl.
  *H01L 29/78*  (2006.01)
  *H01L 49/02*  (2006.01)
  *H10B 12/00*  (2023.01)

(56) References Cited

U.S. PATENT DOCUMENTS

| | | | |
|---|---|---|---|
| 11,183,579 | B2 | 11/2021 | Kim |
| 2010/0213537 | A1 | 8/2010 | Fukuzumi et al. |
| 2020/0395461 | A1* | 12/2020 | Kim ..................... H01L 29/516 |
| 2023/0016938 | A1* | 1/2023 | Jang ..................... H10B 12/00 |
| 2023/0345694 | A1* | 10/2023 | Jang ..................... H10B 12/00 |

FOREIGN PATENT DOCUMENTS

| | | | |
|---|---|---|---|
| CN | 109560046 | A | 4/2019 |
| CN | 209216973 | U | 8/2019 |
| CN | 111524795 | A | 8/2020 |
| CN | 111668161 | A | 9/2020 |
| CN | 112103341 | A | 12/2020 |
| CN | 112447602 | A | 3/2021 |
| CN | 113053825 | A | 6/2021 |

OTHER PUBLICATIONS

Second Chinese Office Action and English Translation cited in CN 202110258133.9, mailed Dec. 7, 2021, 8 pages.
International Search Report cited in PCT/CN2021/107423 mailed Sep. 23, 2021, 10 pages.

\* cited by examiner

METHOD FOR FORMING SEMICONDUCTOR STRUCTURES AND SEMICONDUCTOR STRUCTURE

CROSS-REFERENCE TO RELATED APPLICATIONS

The present disclosure is a continuation application of International Patent Application No. PCT/CN2021/107423, filed on Jul. 20, 2021 and titled "METHOD FOR FORMING SEMICONDUCTOR STRUCTURE AND SEMICONDUCTOR STRUCTURE", which is based on and claims the priority to Chinese Patent Application 202110258133.9, titled "METHOD FOR FORMING SEMICONDUCTOR STRUCTURE AND SEMICONDUCTOR STRUCTURE" and filed on Mar. 9, 2021. The entire contents of International Patent Application No. PCT/CN2021/107423 and Chinese Patent Application 202110258133.9 are incorporated herein by reference.

TECHNICAL FIELD

The present disclosure relates to, but not limited to, a method for forming a semiconductor structure and a semiconductor structure.

BACKGROUND

As the line width of dynamic random access memories (DRAMs) decreases gradually, the distance between adjacent bit line structures also decreases gradually, resulting in the increase of the depth-to-width ratio of the dielectric layer and capacitor contact holes formed subsequently between adjacent bit line structures.

In the process of patterning sacrificial layers to form trenches required by the dielectric layer between adjacent bit line structures, due to the large depth-to-width ratio of the dielectric layer, the trenches formed by patterning also have a large depth-to-width ratio, so there may be etching residues in the bottom sacrificial layer. The etching residues will lead to the communication between adjacent capacitor contact holes during the subsequent process of forming capacitor contact holes, and thus affect the yield of the semiconductor structure. If secondary etching is performed on the etching residues, the trenches will become larger in size, and the size of the subsequently formed capacitor contact holes is thus affected.

SUMMARY

A aspect of the present disclosure provides a method for forming a semiconductor structure, comprising: providing a substrate, and forming discrete bit line structures on the substrate; forming a first sacrificial layer on the surface of the substrate on the bottoms of gaps of the bit line structures; forming a second sacrificial layer filling the gaps of the discrete bit line structures, the second sacrificial layer being located on the top of the first sacrificial layer, and a material for the first sacrificial layer being different from a material for the second sacrificial layer; patterning the second sacrificial layer and the first sacrificial layer to form openings, the formed openings and the remaining of the second sacrificial layer being arranged alternately in an extension direction of the bit line structures; forming a dielectric layer filling the openings; and, removing the remaining of the first sacrificial layer and the remaining of the second sacrificial layer to form capacitor contact holes, the formed capacitor contact holes and the dielectric layer being arranged alternately in the extension direction of the bit line structures.

A second aspect of the present disclosure provides a semiconductor structure, comprising: a substrate, and discrete bit line structures located on the substrate; a first sacrificial layer, located on the surface of the substrate on the bottoms of gaps of the bit line structures, a thickness of the first sacrificial layer being less than a thickness of the bit line structures; and, a second sacrificial layer, located on the surface of the first sacrificial layer on the bottoms of the gaps of the bit line structures, a material for the first sacrificial layer being different from a material for the second sacrificial layer, the first sacrificial layer and the second sacrificial layer are configured to form a dielectric layer and capacitor contact holes between the discrete bit line structures.

BRIEF DESCRIPTION OF THE DRAWINGS

The drawings incorporated into the specification and constituting a part of the specification show the embodiments of the present disclosure, and are used with the description to explain the principles of the embodiments of the present disclosure. Throughout the drawings, like reference numerals denote like elements. The drawings to be described hereinafter are some but not all of the embodiments of the present disclosure. Those skilled in the art can obtain other drawings according to these drawings without paying any creative effort.

DETAILED DESCRIPTION

The technical solutions in the embodiments of the present disclosure will be described clearly and completely with reference to the drawings in the embodiments of the present disclosure. Apparently, the embodiments to be described are only some but not all of the embodiments of the present disclosure. All other embodiments obtained on the basis of the embodiments in the present disclosure by those skilled in the art without paying any creative effort shall fall into the protection scope of the present disclosure. It is to be noted that the embodiments of the present disclosure and the features in the embodiments can be arbitrarily combined with each other if not conflicted.

In the existing methods for forming a semiconductor structure, the distance between adjacent bit line structures decreases gradually, resulting in the increase of the depth-to-width ratio of the dielectric layer and capacitor contact holes formed subsequently between adjacent bit line structures. In the process of patterning sacrificial layers to form trenches required by the dielectric layer between adjacent bit line structures, due to the large depth-to-width ratio of the dielectric layer, the trenches formed by patterning also have a large depth-to-width ratio, so there may be etching residues in the bottom sacrificial layer. The etching residues will lead to the communication between adjacent capacitor contact holes during the subsequent process of forming capacitor contact holes, and thus affect the yield of the semiconductor structure. If secondary etching is performed on the etching residues, the trenches will become larger in size, and the size of the subsequently formed capacitor contact holes is thus affected.

An embodiment of the present disclosure provides a method for forming a semiconductor structure, comprising following steps: providing a substrate, and forming discrete bit line structures on the substrate; forming a first sacrificial layer on the surface of the substrate on the bottom of gaps of the bit line structures; forming a second sacrificial layer filling the gaps of the discrete bit line structures, the second sacrificial layer being located on the top of the first sacrificial layer, and material for the first sacrificial layer being different from the material for the second sacrificial layer; patterning the second sacrificial layer and the first sacrificial layer to form openings, the formed openings and the remaining of the second sacrificial layer being arranged alternately in an extension direction of the bit line structures; forming a dielectric layer filling the openings; and, removing the remaining of the first sacrificial layer and the remaining of the second sacrificial layer to form capacitor contact holes, the formed capacitor contact holes and the dielectric layer being arranged alternately in the extension direction of the bit line structure.

Figure 1:
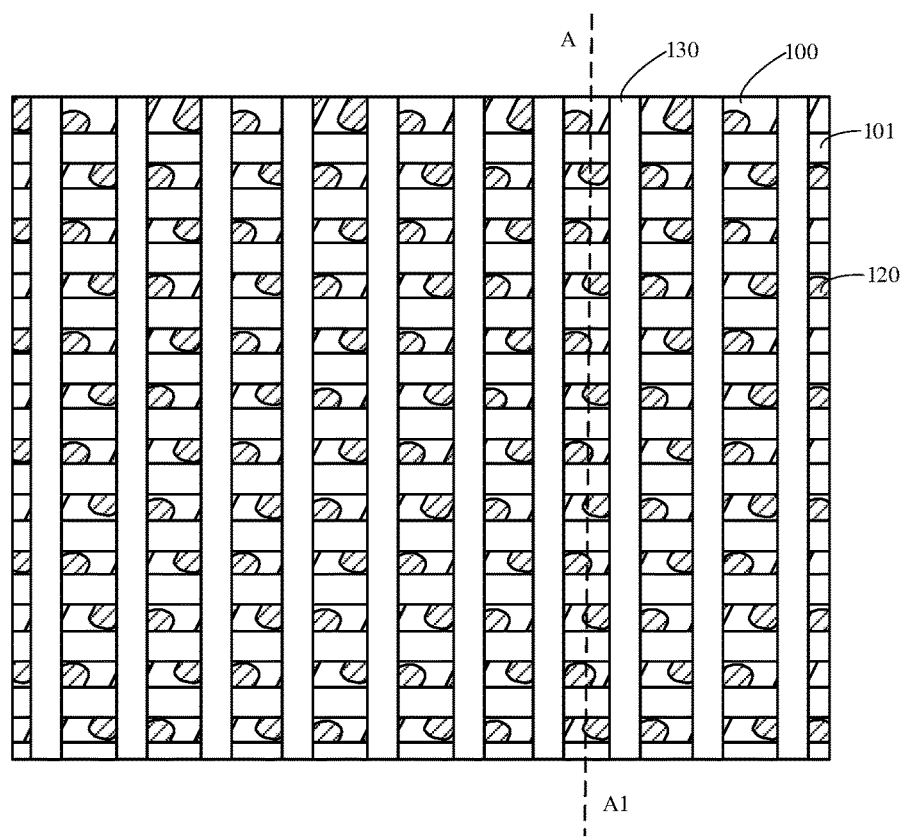
FIG. 1 is a top view of a substrate and bit line structures according to an embodiment of the present disclosure.
Figure 2:
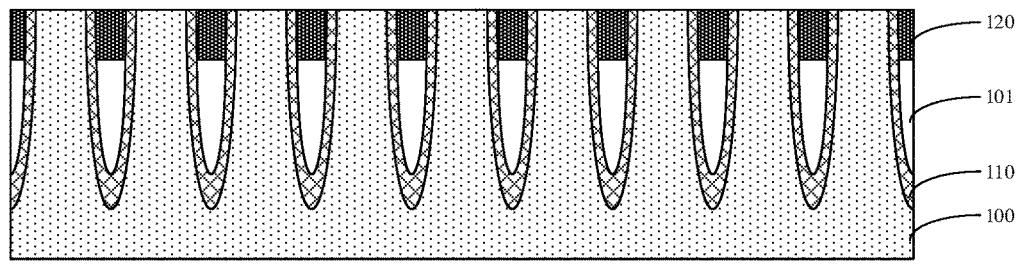
FIG. 2 is a schematic structure diagram of the section of the substrate and the bit line structure in A-A' direction shown in FIG. 1.

FIG. 1 is a top view of the substrate and the bit line structures according to this embodiment; FIGS. 2-10 are sectional views of the steps in the method for forming a semiconductor according to this embodiment; and FIG. 11 is a top view of the dielectric layer and the second sacrificial layer according to this embodiment. The method for forming a semiconductor structure according to this embodiment will be described in detail below with reference to the drawings, specifically:

Referring to FIGS. 1 and 2, a substrate 100 is provided, and discrete bit line structures 130 are formed on the substrate 100.

Referring to FIG. 1, a substrate 100 having active regions 120 and word line structures 101 is provided.

The plurality of active regions 120 are arranged at intervals in parallel. It is to be noted that, in addition to the word line structures 101 and the active regions 120, the substrate 100 further comprises other memory structures, for example, shallow trench isolation structures 110 (referring to FIG. 2), etc. Since other memory structures do not involve the core technology of the present disclosure, they will not be described in detail here. It should be understood by those skilled in the art that, in addition to the word line structures 101 and the active regions 120, the substrate 100 further comprises other memory structures for the normal operation of the memory.

The material for the substrate 100 may comprise sapphire, silicon, silicon carbide, gallium arsenide, aluminum nitride, zinc oxide, etc. In this embodiment, the substrate 100 adopts a silicon material. It will be appreciated by those skilled in the art that, the use of the silicon material as the substrate 100 in this embodiment is convenient for those killed in the art to understand the subsequent formation method and does not constitute any limitation. In practical applications, a proper material for the substrate can be selected as required.

Referring to FIG. 2, the word line structures 101 are buried word line structures located in the substrate 100. In the sectional view of the section AA1 (referring to FIG. 5), the word line structures 101 are located in the shallow trench isolation structures 110, and there is an isolation layer in the shallow trench isolation structures 110. The isolation layer is configured to realize electrical isolation between the word line structures 101 and the conductive structure on the top of the substrate 100.

Continuously referring to FIG. 1, discrete bit line structures 130 are formed on the substrate 100.

The extension direction of the bit line structures 130 is perpendicular to the extension direction of the word line structures 101. Each of the bit line structures 130 comprises a bit line contact layer, a metal layer and a top dielectric layer which are stacked successively. The material for the bit line contact layer comprises tungsten or polycrystalline silicon. The metal layer may be made of one or more conductive materials, such as doped polycrystalline silicon, titanium, titanium nitride, tungsten and tungsten compounds. The material for the top dielectric layer comprises silicon nitride, silicon dioxide, or silicon oxynitride.

Figure 3:
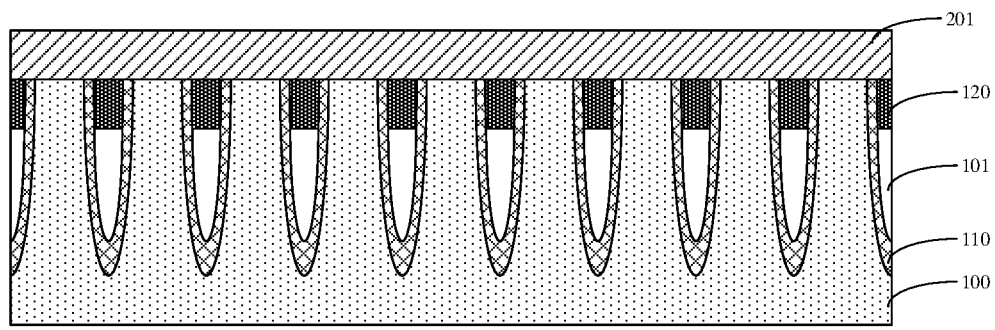
FIG. 3 is a schematic structure diagram of the structure shown in FIG. 2 after a first sacrificial layer is formed on the surface of the substrate on the bottoms of gaps of the bit line structures.

Referring to FIG. 3, a first sacrificial layer 201 is formed on the surface of the substrate 100 on the bottoms of gaps of the bit line structures 130.

The forming a first sacrificial layer 201 on the surface of the substrate 100 on the bottoms of gaps of the bit line structures 130 comprises following steps.

A first sacrificial film (not shown) that covers the tops and sidewalls of the bit line structures 130 and covers the substrate 100 on the bottoms of the gaps of the bit line structures 130 is formed.

In this embodiment, the first sacrificial film (not shown) is formed by atomic layer deposition. The first sacrificial film (not shown) formed by atomic layer deposition has high coverage and density, and the first sacrificial film (not shown) formed on the sidewalls of the bit line structures 130 is thin and easy to remove in the subsequence process. In other embodiments, the first sacrificial film (not shown) may also be formed by chemical vapor deposition.

In an example, the material for the first sacrificial film (not shown) is a carbon-containing material or an oxygen-containing material. In the subsequent process of removing the first sacrificial film (not shown) or the first sacrificial layer 201, the first sacrificial layer (not shown) or the first sacrificial layer 201 may be removed by ashing. The ashing gas reacts with the carbon-containing material or oxygen-containing material to produce gaseous carbon dioxide or liquid water, and the first sacrificial film (not shown) or the first sacrificial layer 201 is converted into carbon dioxide gas or liquid water, so that the first sacrificial film (not shown) or the first sacrificial layer 201 is removed. Moreover, secondary etching of other semiconductor materials is avoided, and the yield of the semiconductor is affected.

The first sacrificial film (not shown) located on the tops and sidewalls of the bit line structures 130 are removed, and the remaining of the first sacrificial film (not shown) forms the first sacrificial layer 201.

In this embodiment, the formed first sacrificial layer 201 has a thickness ranging from 3 to 5 nm, for example, 5 nm, 7 nm or 9 nm. In this embodiment, by forming the first sacrificial layer 201 having a thickness of 3 to 10 nm, the stability of the first sacrificial layer 201 and the second sacrificial layer 202 is improved. If the first sacrificial layer 201 has a thickness of greater than 10 nm, the trenches formed by patterning the first sacrificial layer 201 also has a large depth-to-width ratio, so that there may be etching residues in the first sacrificial layer 201 on the bottom. If the first sacrificial layer 201 has a thickness of less than 3 nm, there is a large difference in thickness between the first sacrificial layer 201 and the second sacrificial layer 202, so that the formed first sacrificial layer 201 and second sacrificial layer 202 are not stable in structure, and the subsequently formed semiconductor structure has structural defects.

Figure 4:
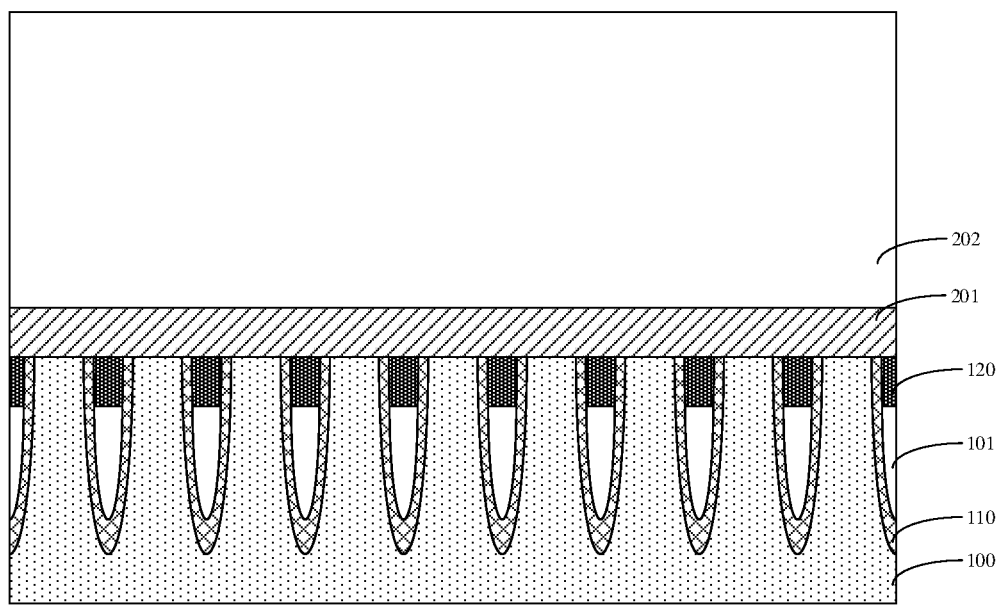
FIG. 4 is a schematic structure diagram of the structure shown in FIG. 3 after a second sacrificial layer filling the gaps of the bit discrete bit line structures is formed.

Referring to FIG. 4, a second sacrificial layer 202 filling the gaps of the discrete bit line structures 130 is formed. The second sacrificial layer 202 is located on the top of the first sacrificial layer 201, and the material for the first sacrificial layer 201 is different from the material for the second sacrificial layer 202.

The material for the first sacrificial layer 201 is different from the material for the second sacrificial layer 202, and the etching selectivity ratio of the material for the first sacrificial layer to the material for the second sacrificial layer when etched by the same etching material is greater than 5:1.

The forming a second sacrificial layer filling the gaps of the discrete bit line structures 130 comprises the following steps.

A second sacrificial film (not shown) that fills the gaps of the bit line structures 130 and covers the bit line structures 130 is formed on the surface of the first sacrificial layer 201.

In this embodiment, the second sacrificial film (not shown) is formed by chemical vapor deposition. The second sacrificial film (not shown) formed by chemical vapor deposition has a higher deposition rate, so it is advantageous to shorten the process period. In other embodiments, the second sacrificial film (not shown) is a hard mask formed by spin coating. The second sacrificial film (not shown) formed by spin coating also has a higher deposition rate, so it is advantageous to shorten the process period.

In this embodiment, the material for the second sacrificial film (not shown) is an insulating material with low density, for example, silicon oxide, silicon oxynitride or other materials. By using the insulating material with low density, a higher etching rate is allowed during the subsequent etching of the second sacrificial layer 202, so that it is advantageous to shorten the process period.

The second sacrificial film (not shown) is planarized until the height of the remaining of the second sacrificial film (not shown) is consistent with the height of the bit line structures 130. The remaining of the second sacrificial film (not shown) forms the second sacrificial layer.

In this embodiment, the density of the first sacrificial layer 201 is less than that of the second sacrificial layer 202. As well-known to those skilled in the art, the density of the material is related to the etched rate of the material. The higher the density is, the lower the etched rate is. By limiting that the density of the first sacrificial layer 201 is less than that of the second sacrificial layer 202, it is easier to remove the first sacrificial layer 201, and the trenches formed by the second sacrificial layer 202 are prevented from being etched by the etching material in the process of etching the first sacrificial layer 201.

In an example, the thickness ratio of the formed first sacrificial layer 201 to the formed second sacrificial layer 202 is less than or equal to 1:10. For example, the thickness ratio of the first sacrificial layer 201 to the second sacrificial layer 202 is 1:3, 1:5, 1:7 or 1:9. In this embodiment, by forming the first sacrificial layer 201 and the second sacrificial layer 202 at a thickness ratio less than or equal to 1:10, the stability of the formed first sacrificial layer 201 and second sacrificial layer 202 is ensured.

In addition, it is to be noted that, the material for the first sacrificial layer 201 comprises, but not limited to, silicon oxide, and the material for the second sacrificial layer 202 comprises, but not limited to, SOH. In other embodiments, the materials for the first sacrificial layer and the second sacrificial layer only need to meet the above thickness range and thickness relationship as long as the technical effects to be achieved in this embodiment can be achieved, so it belongs to the protection scope of the present disclosure.

Figure 5:
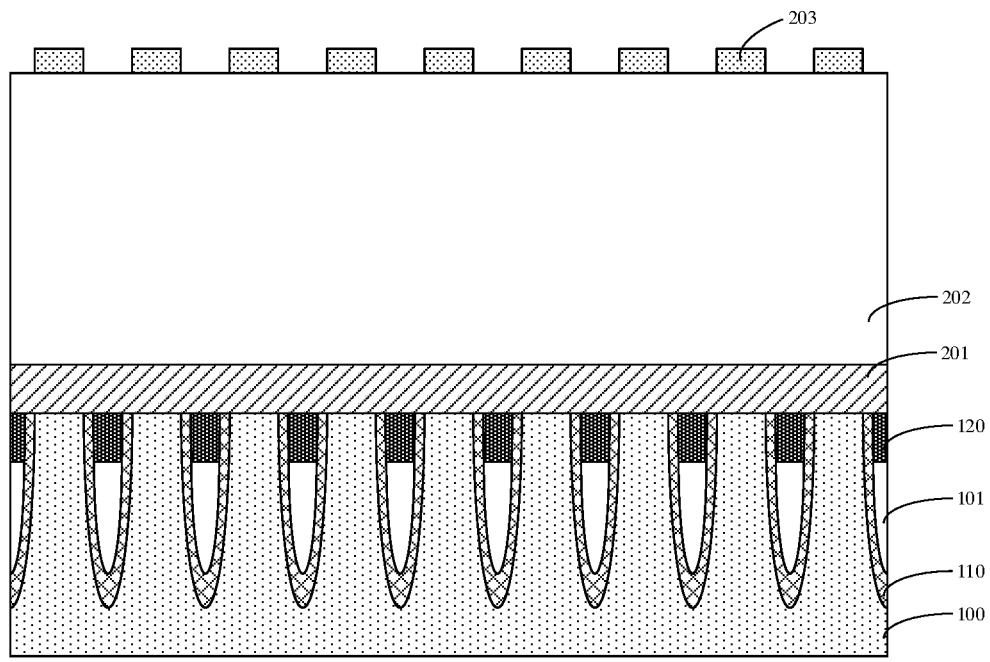
FIG. 5 is a schematic structure diagram the structure shown in FIG. 4 after a patterned photoresist is formed on the top surface of the second sacrificial layer.
Figure 6:
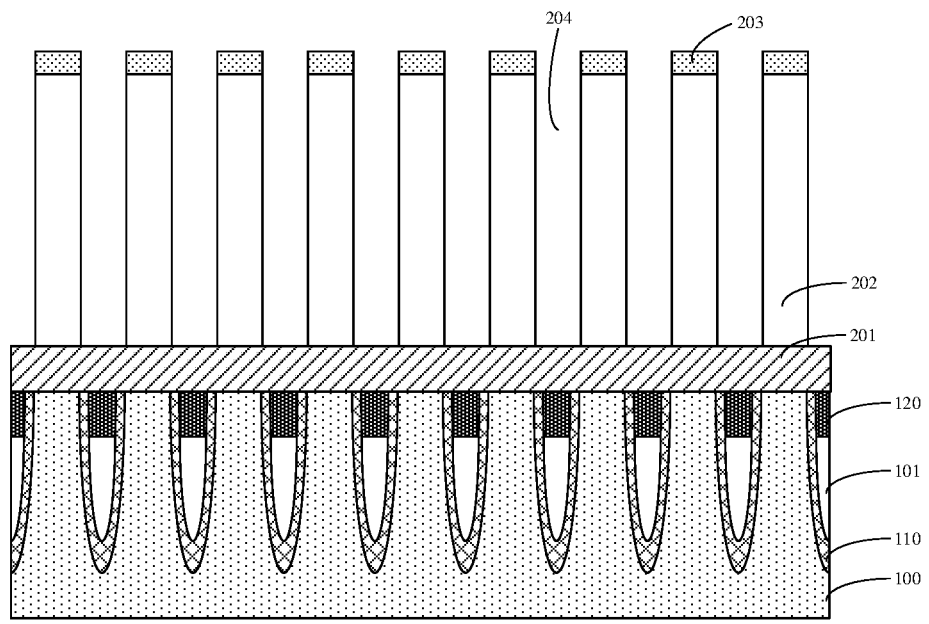
FIG. 6 is a schematic structure diagram of the structure shown in FIG. 5 after a part of the second sacrificial layer is removed on the basis of the patterned photoresist to form pre-openings.
Figure 7:
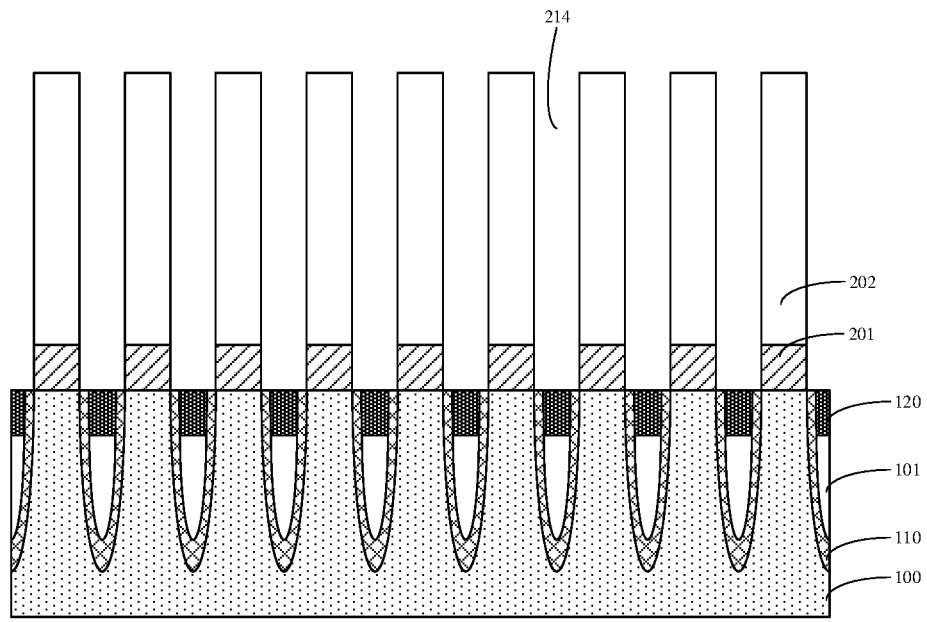
FIG. 7 is a schematic structure diagram of the structure shown in FIG. 6 after the first sacrificial layer exposed by the pre-openings is removed to form openings.

Referring to FIGS. 5-7, the second sacrificial layer 202 and the first sacrificial layer 201 are patterned to form openings 214 (referring to FIG. 7). The formed openings 214 and the remaining of the second sacrificial layer 202 are arranged alternately in the extension direction of the bit line structures 130.

In this embodiment, the patterning the second sacrificial layer 202 and the first sacrificial layer 201 to form openings 214 comprises the following steps.

Referring to FIG. 5, a patterned photoresist 203 is formed on the top surface of the second sacrificial layer 202.

Referring to FIG. 6, a part of the second sacrificial layer 202 is removed on the basis of the patterned photoresist to form pre-openings 204. The formed pre-openings 204 and the remaining of the second sacrificial layer 202 are arranged alternately in the extension direction of the bit line structures 130.

Referring to FIG. 7, the first sacrificial layer 201 exposed by the pre-openings 204 is removed to form openings 214.

The etching selectivity ratio of the used etching material for the material for the first sacrificial layer 201 and the second sacrificial layer 202 is 5:1. At a higher etching selectivity ratio, it is ensured that the trenches formed by etching the second sacrificial layer 202 will not be affected in the process of etching the first sacrificial layer 201.

In other embodiments, a part of the second sacrificial layer and the first sacrificial layer can be removed directly on the basis of the patterned photoresist by a unified etching material in a one-step process to form openings. In this case, the etching selectivity ratio of the used etching material for the material for the first sacrificial layer and the second sacrificial layer is 5:1. At a higher etching selectivity ratio, it is ensured that the trenches formed by etching the second sacrificial layer will not be affected in the process of etching the first sacrificial layer.

Figure 8:
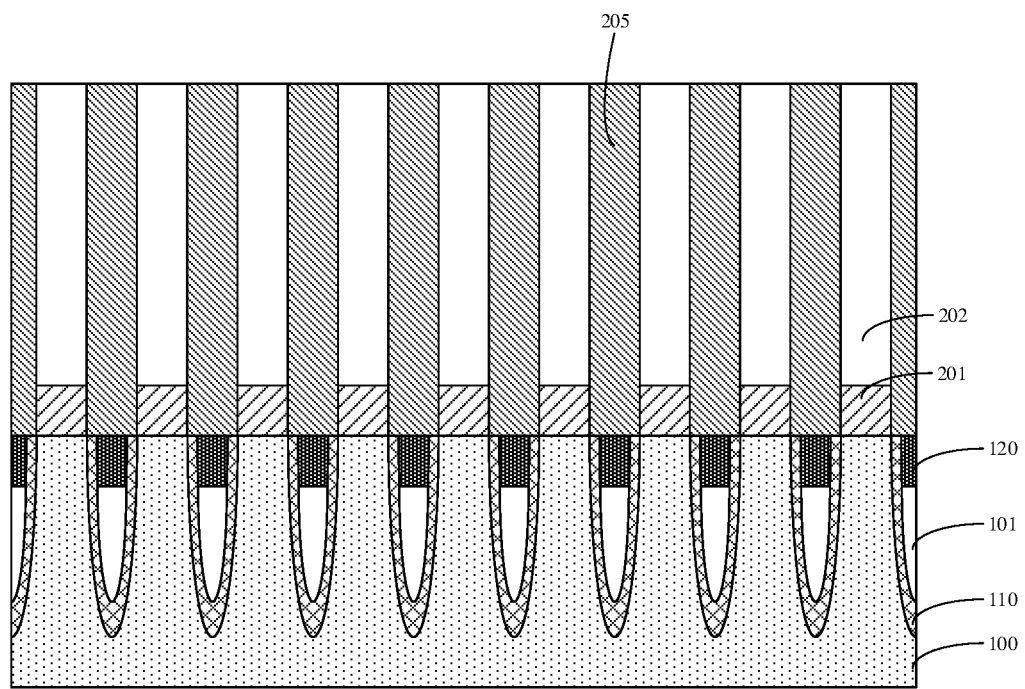
FIG. 8 is a schematic structure diagram of the structure shown in FIG. 7 after a dielectric layer filling the openings is formed.

Referring to FIG. 8, a dielectric layer 205 filling the openings 214 is formed.

The forming a dielectric layer 205 filling the openings 214 comprises the following steps: forming a dielectric film (not shown) that fills the openings 214 and covers the second sacrificial layer 202; and, planarizing the dielectric film until the height of the remaining of the dielectric film (not shown)

is consistent with that of the second sacrificial layer 202, the remaining of the dielectric film (not shown) forming the dielectric layer 205.

Referring to FIG. 11, the formed dielectric layer 205 and the second sacrificial layer 202 are arranged alternately in the extension direction of the bit line structures 130.

In this embodiment, the dielectric film (not shown) is formed by chemical vapor deposition. The dielectric film (not shown) formed by chemical vapor deposition has a higher deposition rate, so it is advantageous to shorten the process period.

In this embodiment, the material for the dielectric layer 205 is silicon nitride. Thus, it is ensured that it is difficult to damage the dielectric layer 205 in the subsequent process for removing the second sacrificial layer 202 and the first sacrificial layer 201. In other embodiments, the material for the dielectric layer may also be silicon oxynitride, silicon carbonitride or other insulating materials.

Figure 9:
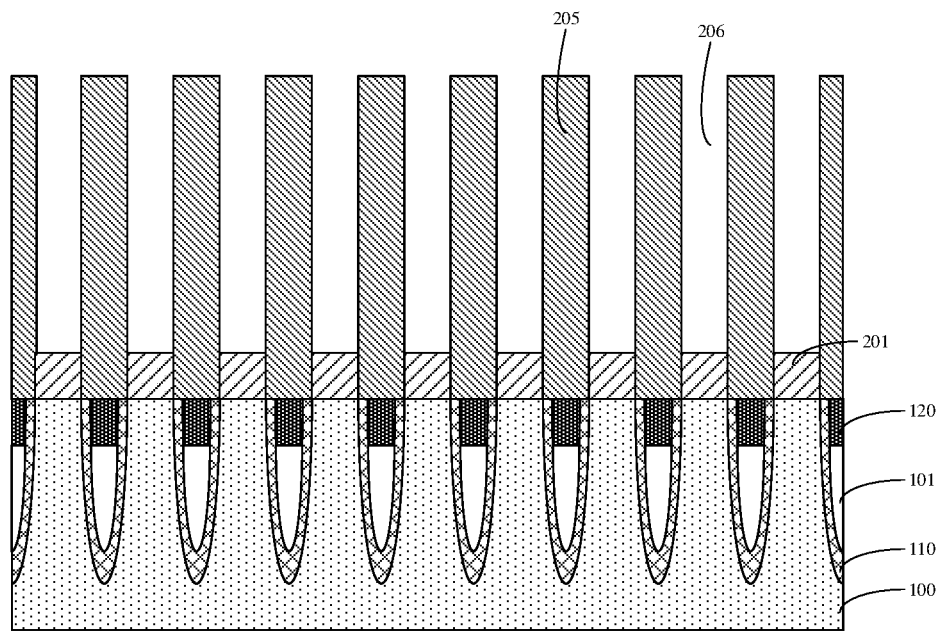
FIG. 9 is a schematic structure diagram of the structure shown in FIG. 8 after the remaining of the second sacrificial layer is removed to form through vias.
Figure 10:
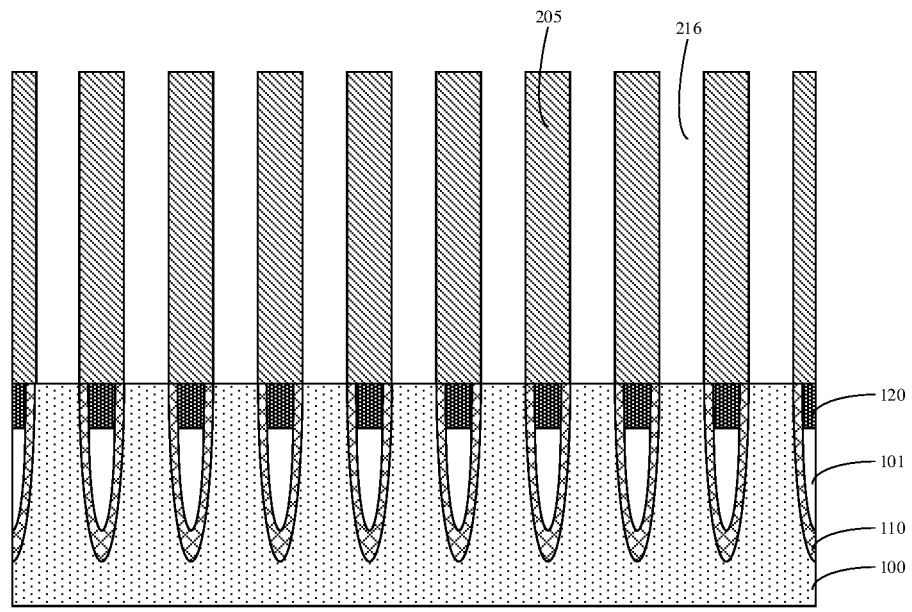
FIG. 10 is a schematic structure diagram of the structure shown in FIG. 9 after the first sacrificial layer on the bottoms of the through vias is removed to form capacitor contact holes.
Figure 11:
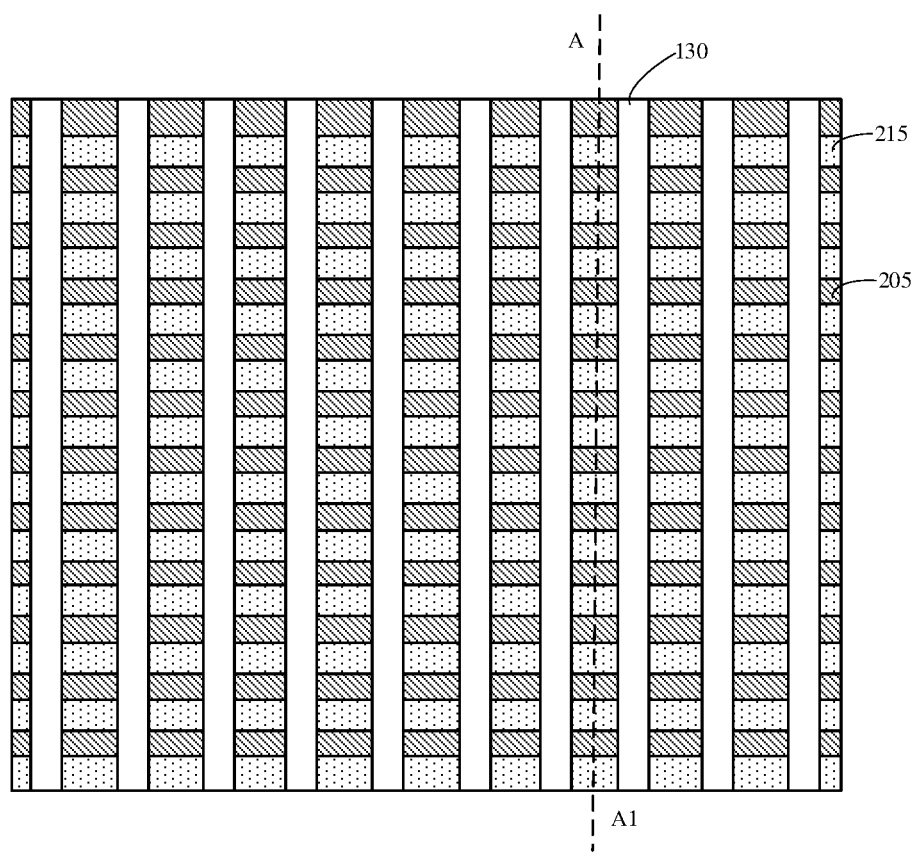
FIG. 11 is a top view of the dielectric layer and the second sacrificial layer according to an embodiment of the present disclosure.

Referring to FIGS. 9 and 10, the remaining of the first sacrificial layer 201 and the second sacrificial layer 202 are removed to form capacitor contact holes 216 (referring to FIG. 10). The formed capacitor contact holes 216 and the dielectric layer 205 are arranged alternately in the extension direction the bit line structures 130.

The removing the remaining of the first sacrificial layer 201 and the second sacrificial layer 202 to form capacitor contact holes 216 comprises the following steps.

Referring to FIG. 9, the remaining of the second sacrificial layer 202 is removed on the basis of the dielectric layer 205 and the bit line structures 130 to form through vias 206, and the through vias 206 expose the first sacrificial layer 201.

In an example, the remaining of the second sacrificial layer 202 is removed by ashing.

The sacrificial layers are removed by ashing to form through vias 206. The size of the formed through vias 206 is approximately equal to that of the second sacrificial layer 202. The ashing gas used in the ashing process comprises one or a combination of more of nitrogen, hydrogen or oxygen. The ashing gas chemically reacts with the sacrificial layers made of a carbon-containing material or an oxygen-containing material. The solid second sacrificial layer 202 produces gaseous carbon dioxide or liquid water, so that the solid state is changed to the gaseous state or liquid state, and the through vias 206 are formed. When the through vias 206 are formed by the ashing process, a large impact force will not be caused on the sidewalls of the through vias 206, and the sidewall collapse is avoided.

Referring to FIG. 10, the first sacrificial layer 201 on the bottoms of the through vias 206 is removed on the basis of the dielectric layer 205 and the bit line structures 130 to form the capacitor contact holes 216.

In addition, in this embodiment, the first sacrificial layer 201 is of a single-layer structure. In other embodiments, the first sacrificial layer may be of a multi-layer structure. In this case, the forming a first sacrificial layer on the surface of the substrate on the bottoms of gaps of the bit line structures comprises the following steps: forming a first sub-sacrificial layer on the surface of the substrate on the bottoms of the gaps of the bit line structures; and, forming a second sub-sacrificial layer on the top surface of the first sub-sacrificial layer, the material for the first sub-sacrificial layer being different from the material for the second sub-sacrificial layer, the first sub-sacrificial layer and the second sub-sacrificial layer forming the first sacrificial layer. By using the first sacrificial layer of a multi-layer structure, the thickness of the sacrificial layers to be etched by each etching process can be decreased, and it can be ensured that there are no etching residues on the bottoms of the trenches formed by each etching process.

It is to be noted that, the method for forming a first sacrificial layer of a double-layer structure has been illustrated above, and a third sub-sacrificial layer, a fourth sacrificial layer or other structures can be formed on the top surface of the second sub-sacrificial layer to realize a first sacrificial layer of a multi-layer structure.

The sacrificial layers formed in the gaps of the discrete bit line structures comprise a first sacrificial layer on the bottom and a second sacrificial layer on the top, and the material for the first sacrificial layer is different from the material for the second sacrificial layer. Thus, during the process of etching the sacrificial layers to form openings, the thickness of the sacrificial layers to be etched by each etching process is decreased, the depth-to-width ratio of the trenches to be formed by a single etching process is reduced, and it is ensured that there are no etching residues on the bottoms of the trenches formed by each etching process. In addition, since the material for the first sacrificial layer is different from the material for the second sacrificial layer, the trenches formed by etching the second sacrificial layer will not be affected in the process of etching the first sacrificial layer, and it is ensured that completely etched trenches are formed without affecting the size of the dielectric layer and the size of the capacitor contact holes.

The division of the steps above is just for clarity of description. When implemented, the steps may be combined into one step or some steps may be split and decomposed into multiple steps, as long as they include the same logical relationship, without departing from the scope of the present application. Adding insignificant modifications to the process or introducing insignificant designs without changing the key design of the process are within the protection scope of the present application.

Another aspect of the present disclosure provides a semiconductor structure, comprising: a substrate, and discrete bit line structures located on the substrate; a first sacrificial layer, located on the surface of the substrate on the bottoms of gaps of the bit line structures, the thickness of the first sacrificial layer being less than that of the bit line structures; and, a second sacrificial layer, located on the surface of the first sacrificial layer on the bottoms of the gaps of the bit line structures, the material for the first sacrificial layer being different from the material for the second sacrificial layer, wherein the first sacrificial layer and the second sacrificial layer are configured to form a dielectric layer and capacitor contact holes between the discrete bit line structures.

FIG. 4 is a sectional view of the semiconductor structure according to this embodiment. The semiconductor structure according to this embodiment will be described in detail below with reference to the drawings, specifically;

Referring to FIG. 4, the semiconductor structure comprises:

a substrate 100, and discrete bit line structures 130 located on the substrate 100.

The substrate 100 comprises active regions and word line structures 101. The plurality of active regions 120 are arranged at intervals in parallel. It is to be noted that, in addition to the word line structures 101 and the active regions 120, the substrate 100 further comprises other memory structures, for example, shallow trench isolation structures 110 (referring to FIG. 2), etc. Since other memory structures do not involve the core technology of the present disclosure, they will not be described in detail here. It should be understood by those skilled in the art that, in addition to the word line structures 101 and the active regions 120, the substrate 100 further comprises other memory structures for the normal operation of the memory.

The material for the substrate 100 may comprise sapphire, silicon, silicon carbide, gallium arsenide, aluminum nitride, zinc oxide, etc. In this embodiment, the substrate 100 adopts a silicon material. It will be appreciated by those skilled in the art that, the use of the silicon material as the substrate 100 in this embodiment is convenient for those killed in the art to understand the subsequent formation method and does not constitute any limitation. In practical applications, a proper material for the substrate can be selected as required.

The word line structures 101 are buried word line structures located in the substrate 100. In the sectional view of the section AA1 (referring to FIG. 1), the word line structures 101 are located in the shallow trench isolation structures 110, and there is an isolation layer in the shallow trench isolation structures 110. The isolation layer is configured to realize electrical isolation between the word line structures 101 and the conductive structure on the top of the substrate 100.

Referring to FIG. 1, discrete bit line structures 130 are formed on the substrate 100.

The extension direction of the bit line structures 130 is perpendicular to the extension direction of the word line structures 101. Each of the bit line structures 130 comprises a bit line contact layer, a metal layer and a top dielectric layer which are stacked successively. The material for the bit line contact layer comprises tungsten or polycrystalline silicon. The metal layer may be made of one or more conductive materials, such as doped polycrystalline silicon, titanium, titanium nitride, tungsten and tungsten compounds. The material for the top dielectric layer comprises silicon nitride, silicon dioxide, or silicon oxynitride.

The semiconductor structure further comprises: a first sacrificial layer 201, located on the surface of the substrate 100 on the bottoms of gaps of the bit line structures 130, the thickness of the first sacrificial layer 201 being less than that of the bit line structures 130.

The semiconductor structure further comprises: a second sacrificial layer 202, located on the surface of the first sacrificial layer 201 on the bottoms of the gaps of the bit line structures 130, the material for the first sacrificial layer 201 being different from the material for the second sacrificial layer 202.

In this embodiment, the formed first sacrificial layer 201 has a thickness ranging from 3 to 5 nm, for example, 5 nm, 7 nm or 9 nm. In this embodiment, by forming the first sacrificial layer 201 having a thickness of 3 to 10 nm, the stability of the first sacrificial layer 201 and the second sacrificial layer 202 is improved. If the first sacrificial layer 201 has a thickness of greater than 10 nm, the trenches formed by patterning the first sacrificial layer 201 also has a large depth-to-width ratio, so that there may be etching residues in the first sacrificial layer 201 on the bottom. If the first sacrificial layer 201 has a thickness of less than 3 nm, there is a large difference in thickness between the first sacrificial layer 201 and the second sacrificial layer 202, so that the formed first sacrificial layer 201 and second sacrificial layer 202 are not stable in structure, and the subsequently formed semiconductor structure has structural defects.

In this embodiment, the thickness ratio of the formed first sacrificial layer 201 to the formed second sacrificial layer 202 is less than or equal to 1:10. For example, the thickness ratio of the first sacrificial layer 201 to the second sacrificial layer 202 is 1:3, 1:5, 1:7 or 1:9. In this embodiment, by forming the first sacrificial layer 201 and the second sacrificial layer 202 at a thickness ratio less than or equal to 1:10, the stability of the formed first sacrificial layer 201 and second sacrificial layer 202 is ensured.

The material for the first sacrificial layer 201 is different from the material for the second sacrificial layer 202, and the etching selectivity ratio of the material for the first sacrificial layer to the material for the second sacrificial layer when etched by the same etching material is greater than 5:1. At a higher etching selectivity ratio, it is ensured that the trenches formed by etching the second sacrificial layer 202 will not be affected in the process of etching the first sacrificial layer 201.

The first sacrificial layer 201 and the second sacrificial layer 202 are configured to form a dielectric layer and capacitor contact holes between the discrete bit line structures.

The sacrificial layers in the gaps of the discrete bit line structures comprise a first sacrificial layer on the bottom and a second sacrificial layer on the top, and the material for the first sacrificial layer is different from the material for the second sacrificial layer. Thus, the depth-to-width ratio of the trenches to be formed by etching the sacrificial layers by a single etching process is reduced, and it is ensured that there are no etching residues on the bottoms of the trenches formed by each etching process. In addition, since the material for the first sacrificial layer is different from the material for the second sacrificial layer, the trenches formed by etching the second sacrificial layer will not be affected in the process of etching the first sacrificial layer, and it is ensured that completely etched trenches are formed without affecting the size of the dielectric layer and the size of the capacitor contact holes.

Various embodiments or implementations in this specification have been described progressively, and each embodiment focuses on the differences from other embodiments, so the same and similar parts of the embodiments may refer to each other.

In the description of this specification, the description with reference to terms "an embodiment", "an exemplary embodiment", "some embodiments", "an illustrative implementation" or "an example" means that specific features, structures, materials or characteristics described with reference to an implementation or example are included in at least one implementation or example of the present disclosure.

In this specification, the schematic expressions of the terms do not necessarily refer to the same implementation or example. In addition, the described specific features, structures, materials or characteristics may be combined in any one or more implementations or examples in a proper way.

In the description of the present disclosure, it should be understood that the orientation or position relationship indicated by terms "center", "upper", "lower", "left", "right", "vertical", "horizontal", "inner", "outer" and the like is an orientation or position relationship illustrated on the basis of the drawings, and is only for describing the present disclosure and simplifying the description, rather than indicating or implying that the specified device or element must have a particular direction and be constructed and operated in a particular direction. Therefore, the terms cannot be interpreted as limitations to the present disclosure.

It should be understood that the terms such as "first" and "second" used in the present disclosure can be used in the present disclosure to describe various structures, but these structures are not limited by these terms. The terms are only used to distinguish a first structure from another structure.

Throughout one or more drawings, the same elements are denoted by similar reference numerals. For clarity, many parts in the drawings are not drawn to scale. In addition, some known parts may not be shown. For simplicity, the structures obtained after several steps can be described in one drawing. Many specific details of the present disclosure are described hereinafter, for example, the structures, materials, sizes, processing processes and technologies of the devices, in order to understand the present disclosure more clearly. As will be understood by those skilled in the art, the present disclosure may be implemented without these specific details.

Finally, it is to be noted that the foregoing embodiments are only used for describing the technical solutions of the present disclosure, rather than limiting the present disclosure. Although the present disclosure has been described in detail by the foregoing embodiments, a person of ordinary skill in the art should understood that modifications can still be made to the technical solutions recorded in the foregoing embodiments or equipment replacements can be made to some or all of the technical features, and these modifications or replacements do not make the essence of the corresponding technical solutions depart from the scope of the technical solutions in the embodiments of the present disclosure.

INDUSTRIAL APPLICABILITY

In the method for forming a semiconductor structure and the semiconductor structure according to the embodiments of the present disclosure, the sacrificial layers in the gaps of the discrete bit line structures comprise a first sacrificial layer on the bottom and a second sacrificial layer on the top, and the material for the first sacrificial layer is different from the material for the second sacrificial layer. Thus, the depth-to-width ratio of the trenches to be formed by etching the sacrificial layers by a single etching process is reduced, and it is ensured that there are no etching residues on the bottoms of the trenches formed by each etching process. In addition, since the material for the first sacrificial layer is different from the material for the second sacrificial layer, the trenches formed by etching the second sacrificial layer will not be affected in the process of etching the first sacrificial layer, and it is ensured that completely etched trenches are formed without affecting the size of the dielectric layer and the size of the capacitor contact holes.

The invention claimed is:

1. A method for forming a semiconductor structure, comprising:
providing a substrate, and forming discrete bit line structures on the substrate;
forming a first sacrificial layer on a surface of the substrate on bottoms of gaps of the bit line structures;
forming a second sacrificial layer filling the gaps of the bit line structures, the second sacrificial layer being located on a top of the first sacrificial layer, and a material for the first sacrificial layer being different from a material for the second sacrificial layer;
patterning the second sacrificial layer and the first sacrificial layer to form openings, the openings and a remaining portion of the second sacrificial layer being arranged alternately in an extension direction of the bit line structures;
forming a dielectric layer filling the openings; and
removing a remaining portion of the first sacrificial layer and the remaining portion of the second sacrificial layer to form capacitor contact holes, the capacitor contact holes and the dielectric layer being arranged alternately in the extension direction of the bit line structures.

2. The method for forming the semiconductor structure according to claim 1, wherein the forming the first sacrificial layer on the surface of the substrate on the bottoms of the gaps of the bit line structures comprises:
forming a first sacrificial film that covers tops and sidewalls of the bit line structures and covers the substrate on the bottoms of the gaps of the bit line structures; and
removing the first sacrificial film located on the tops and the sidewalls of the bit line structures, a remaining portion of the first sacrificial film forming the first sacrificial layer.

3. The method for forming the semiconductor structure according to claim 2, wherein the first sacrificial film is formed by atomic layer deposition.

4. The method for forming the semiconductor structure according to claim 1, wherein the first sacrificial layer has a thickness ranging from 3 to 10 nm.

5. The method for forming the semiconductor structure according to claim 4, wherein a thickness ratio of the first sacrificial layer to the second sacrificial layer is less than or equal to 1:10.

6. The method forming the semiconductor structure according to claim 1, wherein the forming the first sacrificial layer on the surface of the substrate on the bottoms of the gaps of the bit line structures comprises:
forming a first sub-sacrificial layer on the surface of the substrate on the bottoms of the gaps of the bit line structures; and
forming a second sub-sacrificial layer on a top surface of the first sub-sacrificial layer, a material for the first sub-sacrificial layer being different from a material for the second sub-sacrificial layer, the first sub-sacrificial layer and the second sub-sacrificial layer forming the first sacrificial layer.

7. The method for forming the semiconductor structure according to claim 1, wherein the forming the second sacrificial layer filling the gaps of the bit line structures comprises:
forming, on a surface of the first sacrificial layer, a second sacrificial film that fills the gaps of the bit line structures and covers the bit line structures; and
planarizing the second sacrificial film until a height of a remaining portion of the second sacrificial film is equal to a height of the bit line structures, the remaining portion of the second sacrificial film forming the second sacrificial layer.

8. The method for forming the semiconductor structure according to claim 7, wherein the second sacrificial film is formed by chemical vapor deposition.

9. The method for forming the semiconductor structure according to claim 1, wherein an etching selectivity ratio of the material for the first sacrificial layer to the material for the second sacrificial layer is greater than 5:1, when the first sacrificial layer and the second sacrificial layer are etched by a same etching material.

10. The method for forming the semiconductor structure according to claim 1, wherein a density of the material for the first sacrificial layer is less than a density of the material for the second sacrificial layer.

11. The method for forming the semiconductor structure according to claim 1, wherein the patterning the second sacrificial layer and the first sacrificial layer to form the openings comprises:
forming a patterned photoresist on a top surface of the second sacrificial layer;

removing part of the second sacrificial layer based on the patterned photoresist to form pre-openings, the pre-openings and the remaining portion of the second sacrificial layer being arranged alternately in the extension direction of the bit line structures; and removing the first sacrificial layer exposed by the pre-openings to form the openings.

12. The method for forming the semiconductor structure according to claim 1, wherein the patterning the second sacrificial layer and the first sacrificial layer to form the openings comprises:

forming a patterned photoresist on a top surface of the second sacrificial layer; and removing parts of the second sacrificial layer and the first sacrificial layer using a same etching material based on the patterned photoresist to form the openings.

13. The method for forming the semiconductor structure according to claim 1, wherein the forming the dielectric layer filling the openings comprises:

forming a dielectric film that fills the openings and covers the second sacrificial layer; and planarizing the dielectric film until a height of a remaining portion of the dielectric film is equal to a height of the second sacrificial layer, the remaining portion of the dielectric film forming the dielectric layer.

14. The method for forming the semiconductor structure according to claim 1, wherein the removing the remaining portion of the first sacrificial layer and the remaining portion of the second sacrificial layer to form the capacitor contact holes comprises:

removing the remaining portion of the second sacrificial layer based on the dielectric layer and the bit line structures to form through vias, the through vias exposing the first sacrificial layer; and removing the first sacrificial layer on bottoms of the through vias based on the dielectric layer and the bit line structures to form the capacitor contact holes.

15. The method for forming the semiconductor structure according to claim 14, wherein the remaining portion of the second sacrificial layer is removed by ashing.

\* \* \* \* \*